US010858475B2

(12) United States Patent
Hirayama

(10) Patent No.: US 10,858,475 B2
(45) Date of Patent: Dec. 8, 2020

(54) PHOTOSENSITIVE RESIN COMPOSITION FOR OPTICAL WAVEGUIDE AND PHOTOCURABLE FILM FOR FORMING OPTICAL WAVEGUIDE CORE LAYER, AND OPTICAL WAVEGUIDE AND OPTO-ELECTRIC TRANSMISSION HYBRID FLEXIBLE PRINTED WIRING BOARD USING SAME

(71) Applicant: NITTO DENKO CORPORATION, Ibaraki (JP)

(72) Inventor: Tomoyuki Hirayama, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 15/516,967

(22) PCT Filed: Oct. 23, 2015

(86) PCT No.: PCT/JP2015/079912
§ 371 (c)(1),
(2) Date: Apr. 5, 2017

(87) PCT Pub. No.: WO2016/068025
PCT Pub. Date: May 6, 2016

(65) Prior Publication Data
US 2017/0291984 A1    Oct. 12, 2017

(30) Foreign Application Priority Data

Oct. 28, 2014 (JP) ................. 2014-219300

(51) Int. Cl.
| | |
|---|---|
| C08G 59/18 | (2006.01) |
| G02B 1/04 | (2006.01) |
| C08L 63/00 | (2006.01) |
| C08G 59/22 | (2006.01) |
| G03F 7/038 | (2006.01) |
| H05K 1/02 | (2006.01) |
| C08G 59/68 | (2006.01) |
| G03F 7/004 | (2006.01) |
| H01L 51/00 | (2006.01) |
| H05K 1/11 | (2006.01) |

(52) U.S. Cl.
CPC ......... *C08G 59/186* (2013.01); *C08G 59/226* (2013.01); *C08G 59/68* (2013.01); *C08L 63/00* (2013.01); *G02B 1/045* (2013.01); *G02B 1/046* (2013.01); *G02B 1/048* (2013.01); *G03F 7/0043* (2013.01); *G03F 7/038* (2013.01); *G03F 7/0385* (2013.01); *H01L 51/0034* (2013.01); *H05K 1/0274* (2013.01); *H01L 51/0097* (2013.01); *H05K 1/118* (2013.01); *H05K 2201/0108* (2013.01); *H05K 2203/0514* (2013.01); *H05K 2203/0525* (2013.01)

(58) Field of Classification Search
None
See application file for complete search history.

(56) References Cited

U.S. PATENT DOCUMENTS

| | | | | | |
|---|---|---|---|---|---|
| 4,474,929 | A | * | 10/1984 | Schrader | C07D 303/24 525/480 |
| 4,882,245 | A | * | 11/1989 | Gelorme | G03F 7/0385 430/14 |
| 9,086,534 | B2 | | 7/2015 | Hirayama | |
| 2008/0085985 | A1 | | 4/2008 | Nakamura et al. | |
| 2008/0260341 | A1 | | 10/2008 | Shibata et al. | |
| 2008/0285931 | A1 | | 11/2008 | Hikita | |
| 2012/0033913 | A1 | | 2/2012 | Kondou et al. | |
| 2013/0236149 | A1 | | 9/2013 | Hirayama | |
| 2014/0140672 | A1 | | 5/2014 | Hirayama | |

FOREIGN PATENT DOCUMENTS

| | | |
|---|---|---|
| CN | 101441299 A | 5/2009 |
| CN | 101592860 A | 12/2009 |
| CN | 102365330 A | 2/2012 |
| CN | 103823332 A | 5/2014 |

(Continued)

OTHER PUBLICATIONS

International Search Report dated Dec. 15, 2015, issued in counterpart application No. PCT/JP2015/079912 . (2 pages).
Notification of Transmittal of Translation of the International Preliminary Report on Patentability (Forms PCT/IB/338) issued in counterpart International Application No. PCT/JP2015/079912 dated May 11, 2017 with Forms PCT/IB/373 and PCT/ISA/237. (7 pages).
Office Action dated Aug. 17, 2018, issued in counterpart Chinese Application 201580056632.2, with English translation. (16 pages).

(Continued)

*Primary Examiner* — Megan McCulley
(74) *Attorney, Agent, or Firm* — Westerman, Hattori, Daniels & Adrian, LLP

(57) ABSTRACT

Disclosed is a photosensitive resin composition for an optical waveguide containing a resin component and a photoacid generator. In the photosensitive resin composition, the resin component is constituted of an epoxy resin component containing both an aromatic epoxy resin and an aliphatic epoxy resin, and the content of the aromatic epoxy resin is 55 wt. % or more and less than 80 wt. % of the entirety of the epoxy resin component and the content of the aliphatic epoxy resin is more than 20 wt. % and 45 wt. % or less of the entirety of the epoxy resin component. Accordingly, for example, when a core layer of an optical waveguide is formed using the disclosed photosensitive resin composition for an optical waveguide, a core layer of an optical waveguide having satisfactorily low tackiness and high transparency while maintaining satisfactory roll-to-roll compatibility and a high resolution patterning property can be formed.

7 Claims, No Drawings

(56) References Cited

FOREIGN PATENT DOCUMENTS

| | | |
|---|---|---|
| JP | 2008-133442 A | 6/2008 |
| JP | 2008-287014 A | 11/2008 |
| JP | 2009-249467 A | 10/2009 |
| JP | 2010-230944 A | 10/2010 |
| JP | 2011-52225 A | 3/2011 |
| JP | 2012-128360 A | 7/2012 |
| JP | 2012-140501 A | 7/2012 |
| JP | 2013-186462 A | 9/2013 |
| JP | 2014-102348 A | 6/2014 |
| TW | 200831583 A | 8/2008 |
| TW | 201425383 A | 7/2014 |
| WO | 2011/136084 A1 | 11/2011 |

OTHER PUBLICATIONS

Office Action dated Apr. 24, 2018, issued in counterpart Japanese Application No. 2014-219300, with English translation (6 pages).
Office Action and Search Report dated Apr. 18, 2019, issued in counterpart TW Application No. 104134922, with English translation. (11 pages).

* cited by examiner

PHOTOSENSITIVE RESIN COMPOSITION FOR OPTICAL WAVEGUIDE AND PHOTOCURABLE FILM FOR FORMING OPTICAL WAVEGUIDE CORE LAYER, AND OPTICAL WAVEGUIDE AND OPTO-ELECTRIC TRANSMISSION HYBRID FLEXIBLE PRINTED WIRING BOARD USING SAME

TECHNICAL FIELD

The present disclosure relates to a photosensitive resin composition for an optical waveguide and a photocurable film for forming an optical waveguide core layer each of which is used as a material for forming, for example, a core layer constituting an optical waveguide in an opto-electric transmission hybrid flexible printed wiring board to be widely used in optical communication, optical information processing, and any other general optics, and an optical waveguide and an opto-electric transmission hybrid flexible printed wiring board using the same.

BACKGROUND ART

Hitherto, various photosensitive resin compositions have been used as an optical waveguide core layer-forming material intended for an opto-electric transmission hybrid flexible printed wiring board, and in formation of the pattern of a core layer using the composition, a desired core pattern has been produced by performing ultraviolet (UV) irradiation through, for example, a photomask.

In addition, in blending design of the optical waveguide core layer-forming material, a refractive index higher than that of a cladding layer-forming material is required, and hence blending design involving using a resin having high aromaticity is generally performed. As an improving method for an optical loss at a wavelength of 850 nm in the optical waveguide core layer-forming material, there is given a method involving increasing a purity of a raw material resin to improve transparency, thereby hindering the absorption peak thereof from shifting from a short-wavelength region to a wavelength of 850 nm. Further, in the case of using a photocurable resin composition, reduction of an amount of a photopolymerization initiator to be blended has become a design theory (Patent Literatures 1 and 2).

RELATED ART DOCUMENT

Patent Document

PTL 1: JP-A-2010-230944
PTL 2: JP-B-2011-52225

SUMMARY OF INVENTION

However, in an optical waveguide using light having a wavelength of 850 nm as propagating light, the peak of the fourth harmonic absorption (aromatic $4v_{CH}$) of the vibration absorption of a C—H bond derived from the skeleton of an organic resin shifts to the wavelength of 850 nm. Accordingly, no matter how the transparency of a resin material is secured, there is a limitation on the reduction of a loss. Therefore, there is a demand for further lowering of the loss in an application with the purpose of long-distance transmission.

For example, when a resin component is constituted only of an aliphatic resin, an influence of vibration absorption derived from $4v_{CH}$ at a wavelength of 850 nm can be almost completely eliminated. However, in this case, the refractive index of the aliphatic resin is generally about 1.51, and hence a cladding layer-forming material needs to be designed by blending design involving mainly using a resin material having a refractive index lower than that of the aliphatic resin. However, for example, a silicone-based resin or a fluorine-based resin is generally used as a low-refractive-index material, and hence resin-based materials compatible thereto are limited.

Incidentally, in an optical waveguide often used in an electrical/electronic material application, it has been desired that a choice to use each of the above-mentioned resins be avoided from the viewpoint of the occurrence of outgas sing of a cyclic siloxane compound due to heating in the case of the silicone-based resin, and from the viewpoints of extremely high cost, and blending design and processability in association with remarkably low compatibility with other aliphatic resins in the case of the fluorine-based resin. That is, under the present circumstances, it is no exaggeration to say that there is no low-refractive-index resin material that can be used in a general industrial application requiring low cost.

As apparent from the foregoing, there is a strong demand for a material for use as a core layer-forming material having low $4v_{CH}$ vibration absorption at a wavelength of 850 nm while maintaining a high refractive index.

The present disclosure has been made in view of such circumstances, and an object is to provide, as a material for forming an optical waveguide, in particular, a core layer-forming material, a low-cost photosensitive resin composition for an optical waveguide and photocurable film for forming an optical waveguide core layer each having satisfactorily low tackiness and also having high transparency and a low loss while maintaining satisfactory roll-to-roll (R-to-R) compatibility and a high resolution patterning property, and an optical waveguide and an opto-electric transmission hybrid flexible printed wiring board using the same.

In order to achieve the above-mentioned object, according to a first aspect, there is provided a photosensitive resin composition for an optical waveguide, including: a resin component; and a photoacid generator, in which the resin component includes an epoxy resin component containing both an aromatic epoxy resin and an aliphatic epoxy resin, in which a content of the aromatic epoxy resin is 55 wt. % or more and less than 80 wt. % of an entirety of the epoxy resin component, and in which a content of the aliphatic epoxy resin is more than 20 wt. % and 45 wt. % or less of the entirety of the epoxy resin component.

In addition, according to a second aspect, there is provided a photocurable film for forming an optical waveguide core layer, including the photosensitive resin composition for an optical waveguide of the first aspect, the photosensitive resin composition being formed into a film shape.

Further, according to a third aspect, there is provided an optical waveguide, including: a base material; a cladding layer formed on the base material; and a core layer formed in the cladding layer in a predetermined pattern and configured to propagate an optical signal, in which the core layer is formed by curing the photosensitive resin composition for an optical waveguide of the first aspect or the photocurable film for forming an optical waveguide core layer of the second aspect.

Further, according to a fourth aspect, there is provided an opto-electric transmission hybrid flexible printed wiring board, including the optical waveguide of the third aspect.

The inventor has made extensive investigations in order to obtain a low-cost photosensitive resin composition serving as a core layer-forming material for an optical waveguide, having high transparency and a low loss while maintaining satisfactory R-to-R compatibility and a high resolution patterning property. As a result, the inventor has found that the desired object is achieved when, as described above, a photosensitive epoxy resin composition in which a resin component is constituted of an epoxy resin component containing both an aromatic epoxy resin and an aliphatic epoxy resin and in which their blending ratio is set to fall within a specific range is used. Thus, the inventor has reached the present disclosure.

That is, with regard to [1] tackiness, the tackiness depends on the amount of a liquid component present after application and drying, and hence low tackiness can be imparted by constituting the resin component only of a solid resin component. With regard to [2] R-to-R compatibility (uncured film flexibility), the compatibility depends on the flexibility of a coating film after its application and drying under normal temperature, and hence a blending balance that does not inhibit other required properties is achieved by setting the blending ratio of the aromatic epoxy resin and the aliphatic epoxy resin in their combined use to fall within a specific range, with the result that flexibility is imparted to an amorphous film in an uncured state during film (layer) formation. With regard to [3] a linear loss, from the viewpoints of using, as a raw material to be used, a material having a low hue, and using a material free of baking yellowing at the time of post-exposure baking (PEB), a low linear loss can be imparted by performing blending design involving blending, at a specific ratio, the aromatic epoxy resin having a low influence of fourth harmonic absorption ($4v_{CH}$) derived from a C—H bond in the vicinity of a wavelength of 850 nm and the aliphatic epoxy resin. With regard to [4] a bending loss, the bending loss is derived from a property of confining light in a core layer, and hence when a relative refractive index difference between the core layer and a cladding layer is increased, the confining property tends to be enhanced. However, excessively increased aromaticity increases aromatic C—H bond vibration absorption (aromatic $4v_{CH}$) to influence the linear loss, and hence a low bending loss can be imparted by adopting blending design capable of achieving a balance between both the aromatic epoxy resin and the aliphatic epoxy resin.

For such reasons, through the use of a photosensitive resin composition for an optical waveguide set to the above-mentioned blending composition, satisfactorily low tackiness and high transparency (low loss) are obtained while satisfactory R-to-R compatibility and a high resolution patterning property are maintained. Thus, the inventor has reached the present disclosure.

With regard to the high transparency (low loss), the high transparency results from a resin skeleton to be used and a related-art core layer-forming material is required to have a refractive index higher than that of a cladding layer, and hence an aromatic skeleton-containing resin is used in terms of its design. However, the waveband of propagating light having a wavelength of 850 nm overlaps the tailing of the fourth harmonic absorption ($4v_{CH}$) of vibration absorption derived from a C—H bond of an aromatic ring owing to the presence of the aromatic skeleton, and hence there has been a limitation on the reduction of a loss equal to or more than a certain level. In the present disclosure, in the core layer-forming material, material design eliminating the influence of the fourth harmonic absorption ($4v_{CH}$) derived from a C—H bond of an aromatic ring is achieved by using the aromatic epoxy resin and the aliphatic epoxy resin in combination and adopting blending design involving setting their blending ratio to fall within a specific range.

As described above, the present disclosure is the photosensitive resin composition for an optical waveguide in which the resin component is constituted of the epoxy resin component in which the aromatic epoxy resin and the aliphatic epoxy resin are blended at a specific ratio and in which a liquid resin is set to a specific ratio in the resin component. Accordingly, for example, when a core layer of an optical waveguide is formed by using the photosensitive resin composition for an optical waveguide, a core layer having high transparency and a low loss can be formed.

DESCRIPTION OF EMBODIMENTS

Next, an embodiment of the present disclosure is described in detail. However, the present disclosure is not limited to the embodiment.

<<Photosensitive Resin Composition for Optical Waveguide>>

A photosensitive resin composition for an optical waveguide (hereinafter sometimes simply referred to as "photosensitive resin composition") of the present disclosure is obtained by using a specific resin component and a photopolymerization initiator. In addition, the present disclosure has a feature in that the specific resin component is constituted of an epoxy resin component containing both an aromatic epoxy resin and an aliphatic epoxy resin. In the present disclosure, the term "liquid" or "solid" means that a substance shows a "liquid" or "solid" state under a temperature of normal temperature (25° C.)

Various components are sequentially described below.

<Aromatic Epoxy Resin>

The aromatic epoxy resin preferably shows a solid state at normal temperature (25° C.), and an example thereof is a solid cresol novolac-type epoxy resin. Specific examples thereof include YDCN-700-10, YDCN-700-7, YDCN-700-5, and YDCN-700-3 (all of which are manufactured by Nippon Steel & Sumikin Chemical Co., Ltd.). Other examples include long-chain bifunctional aromatic bisphenol A-type epoxy resins, such as JER1002, JER1004, JER1007, and JER1010 (all of which are manufactured by Mitsubishi Chemical Corporation). One kind of those resins may be used alone, or two or more kinds thereof may be used in combination.

The content of the aromatic epoxy resin is 55 wt. % or more and less than 80 wt. %, more preferably 60 wt. % or more and 75 wt. % or less of the entirety of the epoxy resin component. That is, when the content is excessively high, an optical loss derived from the fourth harmonic absorption ($4v_{CH}$) of a C—H bond derived from an aromatic ring worsens. In addition, when the content is excessively low, a bending loss worsens owing to a reduction in relative refractive index difference from a cladding layer-forming material.

<Aliphatic Epoxy Resin>

As the aliphatic epoxy resin, for example, one showing a solid state at normal temperature (25° C.) or one showing a liquid state at normal temperature (25° C.) is used, and an example thereof is a liquid hydrogenated bisphenol A-type epoxy resin. In addition, it is preferred to use at least an aliphatic epoxy resin showing a solid state. In this case, a mode in which the aliphatic epoxy resin is formed only of the aliphatic epoxy resin showing a solid state may be adopted, or a mode in which the aliphatic epoxy resin showing a liquid state is used in combination with the aliphatic epoxy resin showing a solid state may be adopted. Specific examples thereof include YX-8034, YX-8000, and YL-7410 (all of which are manufactured by Mitsubishi Chemical Corporation), EPOGOSEY PT (manufactured by Yokkaichi Chemical Company Limited), DENACOL EX-321 (manufactured by Nagase ChemteX Corporation), and EP-4080E (manufactured by ADEKA Corporation). One kind of those resins may be used alone, or two or more kinds thereof may be used in combination. In the present disclosure, the aliphatic epoxy resin refers to a cyclic or acyclic non-aromatic epoxy resin containing no aromatic ring (benzene ring) in the molecule, and is meant to encompass cyclic aliphatic epoxy resins, such as alicyclic epoxy resins.

Further, examples of the aliphatic epoxy resin include aliphatic epoxy resins, such as a 1,2-epoxy-4-(2-oxiranyl) cyclohexane adduct of 2,2-bis(hydroxymethyl)-1-butanol and a hydrogenated bisphenol A-type epoxy resin. Specific examples thereof include EHPE-3150 (manufactured by Daicel Corporation) and YX-8034 (manufactured by Mitsubishi Chemical Corporation). One kind of those aliphatic epoxy resins may be used alone, or two or more kinds thereof may be used in combination.

The content of the aliphatic epoxy resin is more than 20 wt. % and 45 wt. % or less, more preferably from 25 wt. % to 40 wt. % of the entirety of the epoxy resin component. That is, when the content is excessively high, the bending loss worsens owing to a reduction in relative refractive index difference from the cladding layer-forming material. In addition, when the content is excessively low, the ratio of the aromatic epoxy resin relatively increases to increase aromaticity, and a propagation loss at a wavelength of 850 nm worsens owing to an increase in fourth harmonic absorption ($4v_{CH}$) derived from a C—H bond of an aromatic ring.

Further, when the resin component constituted of the epoxy resin component containing both the aromatic epoxy resin and the aliphatic epoxy resin has poor flexibility in an uncured state, flexibility can be supplemented by adding a liquid resin component. In this case, the content of the liquid resin is preferably set to more than 10 wt. % and less than 25 wt. % of the entirety of the resin component, more preferably from 15 wt. % to 22 wt. %. That is, when the content of the liquid resin is excessively low, the following tendency is observed: the flexibility of a produced uncured film reduces, and hence R-to-R compatibility worsens. In addition, when the content is excessively high, the following tendency is observed: surface roughening occurs in a core layer to be formed, and hence tackiness worsens.

<Photoacid Generator>

The photoacid generator is used for imparting curability by photoirradiation to the photosensitive resin composition, for example, for imparting ultraviolet curability.

For example, the following photoacid generator is used as the photoacid generator: triphenylsulfonium hexafluoroantimonate, triphenylsulfonium hexafluorophosphate, p-(phenylthio)phenyldiphenylsulfonium hexafluoroantimonate, p-(phenylthio)phenyldiphenylsulfonium hexafluorophosphate, 4-chlorophenyldiphenylsulfonium hexafluorophosphate, 4-chlorophenyldiphenylsulfonium hexafluoroantimonate, bis[4-(diphenylsulfonio)phenyl] sulfide bishexafluorophosphate, bis[4-(diphenylsulfonio)phenyl] sulfide bishexafluoroantimonate, (2,4-cyclopentadien-1-yl) [(1-methylethyl)benzene]-Fe-hexafluorophosphate, or diphenyliodoniumhexafluoroantimonate. One kind of those photoacid generators may be used alone, or two or more kinds thereof may be used in combination.

Further, the photoacid generator is specifically, for example: a triphenylsulfonium salt-based hexafluoroantimonate-type photoacid generator SP-170 (manufactured by ADEKA Corporation), CPI-101A (manufactured by San-Apro Ltd.), or WPAG-1056 (manufactured by Wako Pure Chemical Industries, Ltd.); or a diphenyliodonium salt-based hexafluoroantimonate-type photoacid generator WPI-116 (manufactured by Wako Pure Chemical Industries, Ltd.).

The content of the photoacid generator is set to preferably from 0.1 part by weight to 3 parts by weight, more preferably from 0.25 part by weight to 1 part by weight with respect to 100 parts by weight of the resin component of the photosensitive resin composition. That is, when the content of the photoacid generator is excessively small, satisfactory photocurability by which the composition is cured through photoirradiation (ultraviolet irradiation) is hardly obtained. When the content is excessively large, the following tendency is observed: the photosensitivity of the composition rises and hence its shape becomes abnormal upon its patterning. In addition, the following tendency is observed: a required physical property concerning an initial loss worsens.

For example, the following additives may be blended as required into the photosensitive resin composition of the present disclosure in addition to the resin component and the photoacid generator: adhesiveness-imparting agents for enhancing an adhesive property, such as a silane-based or titanium-based coupling agent, an olefin-based oligomer, a cycloolefin-based oligomer or polymer, e.g., a norbornene-based polymer, synthetic rubber, and a silicone compound; various antioxidants, such as a hindered phenol-based antioxidant and a phosphorus-based antioxidant; a leveling agent; and an antifoaming agent. Those additives are each appropriately blended to the extent that the effects in the present disclosure are not impaired. One kind of those additives may be used alone, or two or more kinds thereof may be used in combination.

The blending amount of the antioxidant is set to preferably less than 3 parts by weight, particularly preferably 1 part by weight or less with respect to 100 parts by weight of the resin component. That is, when the content of the antioxidant is excessively large, the following tendency is observed: the required physical property concerning the initial loss worsens.

The photosensitive resin composition of the present disclosure may be prepared by stirring and mixing the resin component and the photoacid generator, and as required, any other additive at predetermined blending ratios. Further, the materials may be stirred and dissolved in an organic solvent under heating (e.g., at from about 60° C. to about 90° C.) so that the photosensitive resin composition of the present disclosure may be prepared as a varnish for application. The usage amount of the organic solvent, which is appropriately adjusted, is set to, for example, preferably from 20 parts by weight to 80 parts by weight, particularly preferably from 30 parts by weight to 50 parts by weight with respect to 100 parts by weight of the resin component of the photosensitive resin composition. That is, when the usage amount of the organic solvent is excessively small, the following tendency is observed: the viscosity of the composition prepared as the varnish for application increases and hence its applicability reduces. When the usage amount of the organic solvent is excessively large, the following tendency is observed: it becomes difficult to apply and form the varnish for application into a thick film.

Examples of the organic solvent to be used in preparing the varnish for application include ethyl lactate, methyl ethyl ketone, cyclohexanone, 2-butanone, N,N-dimethylacetamide, diglyme, diethylene glycol methyl ethyl ether, propylene glycol methyl acetate, propylene glycol monomethyl ether, tetramethylfuran, and dimethoxyethane. One kind of those organic solvents may be used alone, or two or more kinds thereof may be used in combination, in, for example, a predetermined amount in the above-mentioned range so that viscosity suitable for application may be obtained.

<<Optical Waveguide>>

Next, an optical waveguide obtained by using the photosensitive resin composition of the present disclosure as a material for forming its core layer is described.

The optical waveguide obtained by the present disclosure includes, for example: a base material; a cladding layer (under cladding layer) formed on the base material in a predetermined pattern; a core layer formed on the cladding layer in a predetermined pattern and configured to propagate an optical signal; and a cladding layer (over cladding layer) formed on the core layer. In addition, in the optical waveguide obtained by the present disclosure, the core layer is formed of the photosensitive resin composition. In addition, with regard to a material for forming the under cladding layer and a material for forming the over cladding layer, resin compositions for forming cladding layers formed of the same component composition may be used, or resin compositions of different component compositions may be used. In the optical waveguide obtained by the present disclosure, the cladding layers each need to be formed so as to have a refractive index smaller than that of the core layer.

In the present disclosure, the optical waveguide may be produced through, for example, the following steps. That is, the base material is prepared and a photosensitive varnish formed of a photosensitive resin composition serving as a cladding layer-forming material is applied onto the base material. The photosensitive varnish is cured by irradiating the varnish-applied surface with light, such as ultraviolet light, and subjecting the surface to heat treatment as required. Thus, the under cladding layer (the lower portion of the cladding layers) is formed.

Next, an uncured layer for forming a core is formed by applying, onto the under cladding layer, a core layer-forming material (photosensitive varnish) obtained by dissolving the photosensitive resin composition of the present disclosure in an organic solvent. At this time, after having been applied, the core layer-forming material (photosensitive varnish) is formed into a film shape serving as an uncured photocurable film for forming an optical waveguide core layer by heating and drying the organic solvent to remove the solvent. Then, a photomask for exposing a predetermined pattern (optical waveguide pattern) is arranged on the surface of the uncured layer for forming a core, and the surface is irradiated with light, such as ultraviolet light, through the photomask and subjected to heat treatment as required. After that, the core layer of the predetermined pattern is formed by dissolving and removing the unexposed portion of the uncured layer for forming a core with a developing solution.

Next, the photosensitive varnish formed of the photosensitive resin composition serving as the cladding layer-forming material is applied onto the core layer. After that, the over cladding layer (the upper portion of the cladding layers) is formed by irradiating the varnish with light, such as ultraviolet light, and subjecting the varnish to heat treatment as required. The target optical waveguide can be produced through such steps.

A material for the base material is, for example, a silicon wafer, a metallic substrate, a polymer film, or a glass substrate. In addition, the metallic substrate is, for example, a stainless-steel plate, such as SUS. In addition, the polymer film is specifically, for example, a polyethylene terephthalate (PET) film, a polyethylene naphthalate film, or a polyimide film. In addition, its thickness is typically set to fall within the range of from 10 μm to 3 mm.

In the photoirradiation, ultraviolet irradiation is specifically performed. A light source for ultraviolet light in the ultraviolet irradiation is, for example, a low-pressure mercury lamp, a high-pressure mercury lamp, or an ultra-high pressure mercury lamp. In addition, the dose of the ultraviolet light is, for example, typically from 10 $mJ/cm^2$ to 20,000 $mJ/cm^2$, preferably from 100 $mJ/cm^2$ to 15,000 $mJ/cm^2$, more preferably from about 500 $mJ/cm^2$ to about 10,000 $mJ/cm^2$.

Further, after the exposure by the photoirradiation, such as the ultraviolet irradiation, heat treatment may be performed for completing curing by a photoreaction. In addition, in ordinary cases, the heat treatment is performed under the conditions of a temperature in the range of from 80° C. to 250° C., preferably from 100° C. to 150° C. and a time in the range of from 10 seconds to 2 hours, preferably from 5 minutes to 1 hour.

In addition, an example of the cladding layer-forming material is a resin composition appropriately containing any of various liquid epoxy resins and solid epoxy resins, such as a bisphenol A-type epoxy resin, a bisphenol F-type epoxy resin, a hydrogenated bisphenol A-type epoxy resin, a fluorinated epoxy resin, and an epoxy-modified silicone resin, and any of the various photoacid generators described above. The resin composition is appropriately subjected to blending design for achieving a lower refractive index than that of the core layer-forming material. Further, in order that the cladding layer-forming material may be prepared and applied as a varnish as required, various conventionally known organic solvents may each be used in an appropriate amount so that viscosity suitable for application may be obtained, and various additives (an antioxidant, an adhesiveness-imparting agent, a leveling agent, and a UV absorber) may each be used in an appropriate amount to the extent that the function of the optical waveguide using the core layer-forming material is not reduced.

As described above, examples of the organic solvent to be used for preparing the varnish include ethyl lactate, methyl ethyl ketone, cyclohexanone, 2-butanone, N,N-dimethylacetamide, diglyme, diethylene glycol methyl ethyl ether, propylene glycol methyl acetate, propylene glycol monomethyl ether, tetramethylfuran, and dimethoxyethane. One kind of those organic solvents may be used alone, or two or more kinds thereof may be used in combination, in an appropriate amount so that viscosity suitable for application may be obtained.

For example, the following methods may each be employed as an application method involving using a material for forming each layer on the base material: an application method involving using a spin coater, a coater, a circular coater, a bar coater, or the like; a method involving forming a gap by means of screen printing or a spacer and injecting the material into the gap on the basis of a capillary phenomenon; and a method involving continuously applying the material with a coater, such as a multicoater, in a R-to-R fashion. In addition, the optical waveguide may be turned into a film-like optical waveguide by peeling and removing the base material.

The optical waveguide thus obtained can be used as, for example, an optical waveguide for an opto-electric transmission hybrid flexible printed wiring board.

EXAMPLES

Next, the present disclosure is described by way of Examples. However, the present disclosure is not limited to these Examples. In Examples, the term "part (s)" means "part (s) by weight" unless otherwise stated.

Example 1

First, prior to the production of an optical waveguide serving as Example, respective photosensitive varnishes serving as a cladding layer-forming material and a core layer-forming material were prepared.

<Preparation of Under Cladding Layer-Forming Material>

Under a light-shielding condition, 67 parts of a solid polyfunctional aliphatic epoxy resin (EHPE-3150, manufactured by Daicel Corporation), 33 parts of a solid hydrogenated bisphenol A-type epoxy resin (YX-8040, manufactured by Mitsubishi Chemical Corporation), 1 part of a photoacid generator (CPI-101A, manufactured by San-Apro Ltd.), 0.5 part of a hindered phenol-based antioxidant (Songnox 1010, manufactured by Kyodo Chemical Co., Ltd.), and 0.5 part of a phosphorus-based antioxidant (HCA, manufactured by Sanko Co., Ltd.) were mixed in 55 parts of ethyl lactate, and were stirred and completely dissolved under heating at 85° C. After that, the solution was cooled to room temperature (25° C.), and was then filtered under heat and pressure with a membrane filter having a diameter of 1.0 μm to prepare a photosensitive varnish serving as an under cladding layer-forming material.

<Preparation of Core Layer-Forming Material>

Under a light-shielding condition, 75 parts of a solid cresol novolac-type solid epoxy resin (YDCN-700-7, manufactured by Nippon Steel & Sumikin Chemical Co., Ltd.), 25 parts of a solid aliphatic polyfunctional alicyclic epoxy resin (EHPE-3150, manufactured by Daicel Corporation), 1 part of a photoacid generator (WPAG-1056, manufactured by Wako Pure Chemical Industries, Ltd.), 0.5 part of a hindered phenol-based antioxidant (Songnox 1010, manufactured by Kyodo Chemical Co., Ltd.), and 0.5 part of a phosphoric acid ester-based antioxidant (HCA, manufactured by Sanko Co., Ltd.) were mixed in 50 parts of ethyl lactate, and were stirred and completely dissolved under heating at 85° C. After that, the solution was cooled to room temperature (25° C.), and was then filtered under heat and pressure with a membrane filter having a diameter of 1.0 μm to prepare a photosensitive varnish serving as a core layer-forming material.

<Preparation of Over Cladding Layer-Forming Material>

Under a light-shielding condition, 60 parts of a solid hydrogenated bisphenol A-type epoxy resin (YX-8040, manufactured by Mitsubishi Chemical Corporation), 30 parts of a solid polyfunctional aliphatic epoxy resin (EHPE-3150, manufactured by Daicel Corporation), 10 parts of a liquid aliphatic epoxy resin (YL-7410, manufactured by Mitsubishi Chemical Corporation), 1 part of a photoacid generator (CPI-101A, manufactured by San-Apro Ltd.), 0.5 part of a hindered phenol-based antioxidant (Songnox 1010, manufactured by Kyodo Chemical Co., Ltd.), and 0.5 part of a phosphorus-based antioxidant (HCA, manufactured by Sanko Co., Ltd.) were mixed in 50 parts of ethyl lactate, and were stirred and completely dissolved under heating at 85° C. After that, the solution was cooled to room temperature (25° C.), and was then filtered under heat and pressure with a membrane filter having a diameter of 1.0 μm to prepare a photosensitive varnish serving as an over cladding layer-forming material.

<<Production of Optical Waveguide>>

<Production of Under Cladding Layer>

The photosensitive varnish serving as the under cladding layer-forming material was applied with a spin coater onto a silicon wafer having a thickness of about 500 μm, and then the organic solvent was removed by drying (130° C.×10 minutes) on a hot plate. Then, the entire surface of the resultant was exposed with a UV irradiator (5,000 mJ/cm² (I-line filter)), and was then post-baked (130° C.×10 minutes) to produce an under cladding layer (thickness: 15 μm) on the silicon wafer.

<Production of Core Layer>

The photosensitive varnish serving as the core layer-forming material was applied with a spin coater onto the under cladding layer formed as described above, and then the organic solvent (ethyl lactate) was removed by drying (130° C.×10 minutes) on a hot plate. Thus, an uncured layer in an uncured film state (core-forming layer) was formed. The formed uncured layer (core-forming layer) was subjected to mask pattern exposure (pattern width/pattern interval (L/S)=50 μm/200 μm) at 9,000 mJ/cm² (integrated at a wavelength of 365 nm) with a UV irradiator (mixed beams (with no band filter)), and was post-baked (130° C.×10 minutes). After that, the resultant was developed (under room temperature (25° C.) for 4 minutes) in γ-butyrolactone and then washed with water, and moisture was removed by drying (120° C.×10 minutes) on a hot plate. Thus, a core layer of a predetermined pattern (thickness: 50 μm) was produced.

<Production of Over Cladding Layer>

The photosensitive varnish serving as the over cladding layer-forming material was applied with a spin coater onto the core layer formed as described above, and then the organic solvent (ethyl lactate) was removed by drying (130° C.×5 minutes) on a hot plate. After that, the resultant was subjected to exposure at 5,000 mJ/cm² (I-line filter) and post-exposure baking treatment (PEB treatment) at 130° C. for 10 minutes to produce an over cladding layer (thickness of over cladding layer on core layer: 10 μm).

Thus, an optical waveguide (total thickness of optical waveguide: 75 μm) in which the under cladding layer was formed on the silicon wafer, the core layer of the predetermined pattern was formed on the under cladding layer, and the over cladding layer was further formed on the core layer was produced.

Example 2

In the preparation of the photosensitive varnish serving as the core layer-forming material, the blending composition of the resin component was changed to 70 parts of a solid cresol novolac-type solid epoxy resin (YDCN-700-7, manufactured by Nippon Steel & Sumikin Chemical Co., Ltd.) and 30 parts of a solid aliphatic polyfunctional alicyclic epoxy resin (EHPE-3150, manufactured by Daicel Corporation). A photosensitive varnish serving as a core layer-forming material was prepared and an optical waveguide was produced in the same manner as in Example 1 except for the foregoing.

Example 3

In the preparation of the photosensitive varnish serving as the core layer-forming material, the blending composition of the resin component was changed to 65 parts of a solid cresol novolac-type solid epoxy resin (YDCN-700-7, manufactured by Nippon Steel & Sumikin Chemical Co., Ltd.) and 35 parts of a solid aliphatic polyfunctional alicyclic epoxy resin (EHPE-3150, manufactured by Daicel Corporation). A photosensitive varnish serving as a core layer-forming material was prepared and an optical waveguide was produced in the same manner as in Example 1 except for the foregoing.

Example 4

In the preparation of the photosensitive varnish serving as the core layer-forming material, the blending composition of the resin component was changed to 60 parts of a solid cresol novolac-type solid epoxy resin (YDCN-700-7, manufactured by Nippon Steel & Sumikin Chemical Co., Ltd.) and 40 parts of a solid aliphatic polyfunctional alicyclic epoxy resin (EHPE-3150, manufactured by Daicel Corporation). A photosensitive varnish serving as a core layer-forming material was prepared and an optical waveguide was produced in the same manner as in Example 1 except for the foregoing.

Example 5

In the preparation of the photosensitive varnish serving as the core layer-forming material, the blending composition of the resin component was changed to 55 parts of a solid cresol novolac-type solid epoxy resin (YDCN-700-7, manufactured by Nippon Steel & Sumikin Chemical Co., Ltd.) and 45 parts of a solid aliphatic polyfunctional alicyclic epoxy resin (EHPE-3150, manufactured by Daicel Corporation). A photosensitive varnish serving as a core layer-forming material was prepared and an optical waveguide was produced in the same manner as in Example 1 except for the foregoing.

Example 6

In the preparation of the photosensitive varnish serving as the core layer-forming material, the blending composition of the resin component was changed to 75 parts of a solid cresol novolac-type solid epoxy resin (YDCN-700-10, manufactured by Nippon Steel & Sumikin Chemical Co., Ltd.), 13 parts of a solid aliphatic polyfunctional alicyclic epoxy resin (EHPE-3150, manufactured by Daicel Corporation), 12 parts of a liquid hydrogenated bisphenol A-type epoxy resin (YX-8034, manufactured by Mitsubishi Chemical Corporation), and 40 parts of ethyl lactate. A photosensitive varnish serving as a core layer-forming material was prepared and an optical waveguide was produced in the same manner as in Example 1 except for the foregoing.

Example 7

In the preparation of the photosensitive varnish serving as the core layer-forming material, the blending composition of the resin component was changed to 55 parts of a solid cresol novolac-type solid epoxy resin (YDCN-700-10, manufactured by Nippon Steel & Sumikin Chemical Co., Ltd.), 25 parts of a solid aliphatic polyfunctional alicyclic epoxy resin (EHPE-3150, manufactured by Daicel Corporation), 20 parts of a liquid hydrogenated bisphenol A-type epoxy resin (YX-8034, manufactured by Mitsubishi Chemical Corporation), and 40 parts of ethyl lactate. A photosensitive varnish serving as a core layer-forming material was prepared and an optical waveguide was produced in the same manner as in Example 1 except for the foregoing.

Comparative Example 1

In the preparation of the photosensitive varnish serving as the core layer-forming material, the blending composition of the resin component was changed to 80 parts of a solid cresol novolac-type solid epoxy resin (YDCN-700-7, manufactured by Nippon Steel & Sumikin Chemical Co., Ltd.) and 20 parts of a solid aliphatic polyfunctional alicyclic epoxy resin (EHPE-3150, manufactured by Daicel Corporation). A photosensitive varnish serving as a core layer-forming material was prepared and an optical waveguide was produced in the same manner as in Example 1 except for the foregoing.

Comparative Example 2

In the preparation of the photosensitive varnish serving as the core layer-forming material, the blending composition of the resin component was changed to 50 parts of a solid cresol novolac-type solid epoxy resin (YDCN-700-7, manufactured by Nippon Steel & Sumikin Chemical Co., Ltd.) and 50 parts of a solid aliphatic polyfunctional alicyclic epoxy resin (EHPE-3150, manufactured by Daicel Corporation). A photosensitive varnish serving as a core layer-forming material was prepared and an optical waveguide was produced in the same manner as in Example 1 except for the foregoing.

Comparative Example 3

In the preparation of the photosensitive varnish serving as the core layer-forming material, the blending composition of the resin component was changed to 80 parts of a solid cresol novolac-type solid epoxy resin (YDCN-700-10, manufactured by Nippon Steel & Sumikin Chemical Co., Ltd.), 20 parts of a liquid hydrogenated bisphenol A-type epoxy resin (YX-8034, manufactured by Mitsubishi Chemical Corporation), and 40 parts of ethyl lactate. A photosensitive varnish serving as a core layer-forming material was prepared and an optical waveguide was produced in the same manner as in Example 1 except for the foregoing.

Comparative Example 4

In the preparation of the photosensitive varnish serving as the core layer-forming material, the blending composition of the resin component was changed to 50 parts of a solid cresol novolac-type solid epoxy resin (YDCN-700-10, manufactured by Nippon Steel & Sumikin Chemical Co., Ltd.), 25 parts of a solid aliphatic polyfunctional alicyclic epoxy resin (EHPE-3150, manufactured by Daicel Corporation), 25 parts of a liquid hydrogenated bisphenol A-type epoxy resin (YX-8034, manufactured by Mitsubishi Chemical Corporation), and 40 parts of ethyl lactate. A photosensitive varnish serving as a core layer-forming material was prepared and an optical waveguide was produced in the same manner as in Example 1 except for the foregoing.

Comparative Example 5

In the preparation of the photosensitive varnish serving as the core layer-forming material, the blending composition of the resin component was changed to 50 parts of a solid cresol novolac-type solid epoxy resin (YDCN-700-10, manufactured by Nippon Steel & Sumikin Chemical Co., Ltd.), 40 parts of a solid aliphatic polyfunctional alicyclic epoxy resin (EHPE-3150, manufactured by Daicel Corporation), 10 parts of a liquid hydrogenated bisphenol A-type epoxy resin (YX-8034, manufactured by Mitsubishi Chemical Corporation), and 40 parts of ethyl lactate. A photosensitive varnish serving as a core layer-forming material was prepared and an optical waveguide was produced in the same manner as in Example 1 except for the foregoing.

Each photosensitive varnish serving as a core layer-forming material and each optical waveguide thus obtained were used, and measurement and evaluation were performed in accordance with methods to be described below for the loss evaluation (linear loss) and r=1.5 mm bending loss of the optical waveguide, tackiness evaluation, and uncured film flexibility evaluation. The results of the measurement and evaluation are shown in Table 1 and Table 2 below together with the blending composition of the core layer-forming material.

[Loss Evaluation (Linear Loss) of Optical Waveguide]

The optical waveguides obtained in Examples and Comparative Examples described above were each used as a sample, and light oscillated from a light source (850 nm VCSEL light source OP250, manufactured by Miki Inc.) was collected with a multimode fiber (FFP-G120-0500, manufactured by Miki Inc. (MMF having a diameter of 50 µm, NA=0.2)) and caused to enter the sample. Then, the light outputted from the sample was collected with a lens (FH14-11, manufactured by Seiwa Optical Co., Ltd. (magnification=20, NA=0.4)), and 6 channels of the light were evaluated with an optical measuring system (OPTICAL MULTIPOWER METER Q8221, manufactured by Advantest Corporation). A linear loss was calculated from the average total loss of the 6 channels, and was evaluated on the basis of the following criteria.

○: The total linear loss was less than 0.05 dB/cm.
x: The total linear loss was 0.05 dB/cm or more.

[r=1.5 mm Bending Loss Evaluation]

The optical waveguides obtained in Examples and Comparative Examples described above were each peeled from the silicon wafer serving as a base material, and wrapped 360° around a metal bar having a diameter of 1.5 mm. An excess loss value in this case was measured and evaluated in the same manner as the linear loss. The result was evaluated on the basis of the following criteria.

○: The excess loss was 0.1 dB/cm or less.
x: The excess loss had a value of more than 0.1 dB/cm.

[Tackiness Evaluation]

Each of the photosensitive varnishes serving as the core layer-forming materials prepared in Examples and Comparative Examples described above was applied onto a silicon wafer having a thickness of about 500 µm with a spin coater, and was dried (pre-baked at 130° C. for 5 minutes) on a hot plate to produce an uncured film layer (thickness: about 50 µm). Whether or not the surface of the resultant uncured film layer was tacky and rough was confirmed by a finger touch, and the result of the confirmation was evaluated on the basis of the following criteria.

○: The surface was free of tack and the roughening of the surface did not occur.
x: The surface had tack and the roughening of the surface occurred.

[Uncured Film Flexibility (R-to-R Compatibility Evaluation)]

Each of the photosensitive varnishes serving as the core layer-forming materials prepared in Examples and Comparative Examples described above was applied onto a SUS base material having a thickness of 50 µm with a spin coater, and was dried (130° C.×5 minutes) to produce an uncured film having a thickness of about 50 µm. The uncured film (amorphous film) formed on the SUS base material was wound around a winding core having a diameter of 8 cm, and the presence or absence of a crack occurring in the film was visually confirmed. The result of the confirmation was evaluated on the basis of the following criteria.

○: No crack occurred.
x: A crack occurred.

TABLE 1

| | | (Part(s)) | | | | | | |
|---|---|---|---|---|---|---|---|---|
| | | Example | | | | | | |
| | | 1 | 2 | 3 | 4 | 5 | 6 | 7 |
| Aromatic epoxy resin | YDCN-700-7 | 75 | 70 | 65 | 60 | 55 | — | — |
| | YDCN-700-10 | — | — | — | — | — | 75 | 55 |
| Aliphatic epoxy resin | EHPE-3150 | 25 | 30 | 35 | 40 | 45 | 13 | 25 |
| | YX-8034 | — | — | — | — | — | 12 | 20 |
| Photoacid generator | WPAG-1056 | 1 | 1 | 1 | 1 | 1 | 1 | 1 |
| Antioxidant | Songnox 1010 | 0.5 | 0.5 | 0.5 | 0.5 | 0.5 | 0.5 | 0.5 |
| | HCA | 0.5 | 0.5 | 0.5 | 0.5 | 0.5 | 0.5 | 0.5 |
| Solvent | Ethyl lactate | 50 | 50 | 50 | 50 | 50 | 40 | 40 |
| Linear loss | | ○ | ○ | ○ | ○ | ○ | ○ | ○ |
| r = 1.5 mm bending loss | | ○ | ○ | ○ | ○ | ○ | ○ | ○ |
| Tackiness | | ○ | ○ | ○ | ○ | ○ | ○ | ○ |
| Uncured film flexibility | | ○ | ○ | ○ | ○ | ○ | ○ | ○ |

TABLE 2

| | | (Part(s)) | | | | |
|---|---|---|---|---|---|---|
| | | Comparative Example | | | | |
| | | 1 | 2 | 3 | 4 | 5 |
| Aromatic epoxy resin | YDCN-700-7 | 80 | 50 | — | — | — |
| | YDCN-700-10 | — | — | 80 | 50 | 50 |
| Aliphatic epoxy resin | EHPE-3150 | 20 | 50 | — | 25 | 40 |
| | YX-8034 | — | — | 20 | 25 | 10 |
| Photoacid generator | WPAG-1056 | 1 | 1 | 1 | 1 | 1 |

TABLE 2-continued (Part(s))

| | | Comparative Example | | | | |
|---|---|---|---|---|---|---|
| | | 1 | 2 | 3 | 4 | 5 |
| Antioxidant | Songnox 1010 | 0.5 | 0.5 | 0.5 | 0.5 | 0.5 |
| | HCA | 0.5 | 0.5 | 0.5 | 0.5 | 0.5 |
| Solvent | Ethyl lactate | 50 | 50 | 40 | 40 | 40 |
| Linear loss | | x | ○ | x | ○ | ○ |
| r = 1.5 mm bending loss | | ○ | x | ○ | x | x |
| Tackiness | | ○ | ○ | ○ | x | ○ |
| Uncured film flexibility | | ○ | ○ | ○ | ○ | x |

As can be seen from the foregoing results, a photosensitive resin composition (product of Examples) obtained by blending the aromatic epoxy resin and the aliphatic epoxy resin within a specific range and an optical waveguide including a core layer formed using the photosensitive resin composition provided satisfactory evaluation results in all of the loss evaluation (linear loss) and r=1.5 mm bending loss of the optical waveguide, the tackiness evaluation, and the uncured film flexibility evaluation.

In contrast, the products of Comparative Examples 1 and 3, in each of which the blending ratio of the aromatic epoxy resin was 80 wt. % in the resin component, provided poor results in linear loss, and the products of Comparative Examples 2, 4, and 5, in each of which the blending ratio of the aromatic epoxy resin was 50 wt. % in the resin component, provided poor results in the r=1.5 mm bending loss evaluation. In addition, in the cases of the products of Comparative Examples 4 and 5 out of Comparative Examples in which YDCN-700-10 having poor uncured film flexibility was used, the product of Comparative Example 4, in which the ratio of the liquid resin was 25 wt. % in the resin component, provided a poor result in tackiness, and the product of Comparative Example 5, in which the ratio of the liquid resin was 10 wt. % in the resin component, provided a poor result in uncured film flexibility.

A specific mode in the present disclosure has been described in Examples described above, but Examples described above are merely illustrative and should not be construed as being limitative. Various modifications apparent to a person skilled in the art are meant to fall within the scope of the present disclosure.

The photosensitive resin composition for an optical waveguide of the present disclosure is useful as a material for forming a core layer constituting an optical waveguide. In addition, an optical waveguide produced by using the photosensitive resin composition for an optical waveguide is used in, for example, an opto-electric transmission hybrid flexible printed wiring board.

The invention claimed is:

1. A photosensitive resin composition for an optical waveguide, consisting of:
   a resin component;
   a photoacid generator; and
   an optional component,
   wherein the resin component comprises an epoxy resin component containing an aromatic epoxy resin and an aliphatic epoxy resin,
   wherein the aromatic epoxy resin shows a solid state,
   wherein the aliphatic epoxy resin contains an aliphatic epoxy resin showing a solid state,
   wherein a content of the aromatic epoxy resin is 55 wt. % or more and less than 80 wt. % of an entirety of the epoxy resin component, and
   wherein a content of the aliphatic epoxy resin is more than 20 wt. % and 45 wt. % or less of the entirety of the epoxy resin component, and
   wherein the optional component is at least one compound selected from the group consisting of:
   (i) an organic solvent selected from the group consisting of ethyl lactate, methyl ethyl ketone, cyclohexanone, 2-butanone, N,N-dimethylacetamide, diglyme, diethylene glycol methyl ethyl ether, propylene glycol methyl acetate, propylene glycol monomethyl ether, tetramethylfuran, dimethoxyethane, and a combination thereof,
   (ii) a coupling agent selected from the group consisting of a silane-based coupling agent, a titanium-based coupling agent, and a combination thereof,
   (iii) an adhesiveness-imparting agent selected from the group consisting of a cycloolefin-based oligomer, a cycloolefin-based polymer, synthetic rubber, and a combination thereof,
   (iv) an antioxidant selected from the group consisting of a hindered phenol-based antioxidant, a phosphorus-based antioxidant, and a combination thereof,
   (v) a leveling agent, and
   (vi) an antifoaming agent.

2. A photocurable film for forming an optical waveguide core layer, comprising the photosensitive resin composition for an optical waveguide of claim 1, wherein the photosensitive resin composition is formed into a film shape.

3. An optical waveguide, comprising:
   a base material;
   a cladding layer formed on the base material; and
   a core layer formed in the cladding layer in a predetermined pattern to propagate an optical signal,
   wherein the core layer is formed by curing the photocurable film for forming an optical waveguide core layer of claim 2.

4. An opto-electric transmission hybrid flexible printed wiring board, comprising the optical waveguide of claim 3.

5. An optical waveguide, comprising:
   a base material;
   a cladding layer formed on the base material; and
   a core layer formed in the cladding layer in a predetermined pattern to propagate an optical signal,
   wherein the core layer is formed by curing the photosensitive resin composition for an optical waveguide of claim 1.

6. An opto-electric transmission hybrid flexible printed wiring board, comprising the optical waveguide of claim 5.

7. The photosensitive resin composition for an optical waveguide according to claim 1, wherein the aromatic epoxy resin is a cresol novolak epoxy resin.

* * * * *